(12) United States Patent
Kim et al.

(10) Patent No.: US 12,150,387 B2
(45) Date of Patent: Nov. 19, 2024

(54) MAGNETIC TUNNELING JUNCTION DEVICE AND MEMORY DEVICE INCLUDING THE SAME

(71) Applicant: Samsung Electronics Co., Ltd., Suwon-si (KR)

(72) Inventors: Kwangseok Kim, Seoul (KR); Seonggeon Park, Seongnam-si (KR); Seungjae Lee, Suwon-si (KR); Naoki Hase, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 193 days.

(21) Appl. No.: 17/982,955

(22) Filed: Nov. 8, 2022

(65) Prior Publication Data
US 2023/0059590 A1 Feb. 23, 2023

Related U.S. Application Data

(63) Continuation-in-part of application No. 17/701,056, filed on Mar. 22, 2022.

(30) Foreign Application Priority Data

Jul. 15, 2021 (KR) .................. 10-2021-0093139

(51) Int. Cl.
*H10N 50/10* (2023.01)
*H10B 61/00* (2023.01)
(Continued)

(52) U.S. Cl.
CPC ............. *H10N 50/10* (2023.02); *H10B 61/22* (2023.02); *H10N 50/80* (2023.02); *H10N 50/85* (2023.02)

(58) Field of Classification Search
CPC ........ H10N 50/10; H10N 50/80; H10N 50/85; H10B 61/22
See application file for complete search history.

(56) References Cited

U.S. PATENT DOCUMENTS 7,304,359 B2 12/2007 Kim et al.
7,663,848 B1 2/2010 Huai et al.
(Continued)

FOREIGN PATENT DOCUMENTS

EP 3347927 B1 11/2019
JP 2006-253637 A 9/2006
(Continued)

OTHER PUBLICATIONS

U.S. Office Action dated Nov. 24, 2023 issued in co-pending U.S. Appl. No. 17/701,056.
(Continued)

*Primary Examiner* — Son L Mai
(74) *Attorney, Agent, or Firm* — Harness, Dickey & Pierce, P.L.C.

(57) ABSTRACT

Provided are a magnetic tunneling junction device having more stable perpendicular magnetic anisotropy (PMA) and/or increased operating speed, and/or a memory device including the magnetic tunneling junction device. The magnetic tunneling junction device includes a free layer having a first surface and a second surface opposite the first surface; a pinned layer facing the first surface of the free layer; a first oxide layer between the pinned layer and the free layer; and a second oxide layer on the second surface of the free layer. The free layer includes a magnetic material X doped with a non-magnetic metal/ The second oxide layer includes $ZO_x$ which is an oxide of a metal Z. An oxygen affinity of the metal Z is greater than an oxygen affinity of the non-magnetic metal X.

20 Claims, 22 Drawing Sheets

(51) Int. Cl.
*H10N 50/80* (2023.01)
*H10N 50/85* (2023.01)

(56) References Cited

U.S. PATENT DOCUMENTS

| | | | |
|---|---|---|---|
| 7,742,263 B2* | 6/2010 | Fukumoto | H01F 10/06 |
| | | | 360/324.11 |
| 7,821,087 B2 | 10/2010 | Nguyen et al. | |
| 8,592,927 B2* | 11/2013 | Jan | G11C 11/161 |
| | | | 257/E29.323 |
| 8,698,260 B2 | 4/2014 | Jan et al. | |
| 8,710,603 B2 | 4/2014 | Jan et al. | |
| 9,349,945 B2 | 5/2016 | Sandhu et al. | |
| 9,425,387 B1 | 8/2016 | Liu et al. | |
| 9,985,200 B2 | 5/2018 | Lee et al. | |
| 10,256,399 B2 | 4/2019 | Hu et al. | |
| 10,475,564 B2 | 11/2019 | Thomas et al. | |
| 10,516,095 B2 | 12/2019 | Yamakawa et al. | |
| 10,522,744 B2 | 12/2019 | Jan et al. | |
| 10,522,752 B1 | 12/2019 | Jan et al. | |
| 10,957,851 B2 | 3/2021 | Jan et al. | |
| 11,063,088 B2 | 7/2021 | Ouellette et al. | |
| 11,264,560 B2 | 3/2022 | Iwata et al. | |
| 11,348,715 B2 | 5/2022 | Jung et al. | |
| 11,417,835 B2 | 8/2022 | Iwata et al. | |
| 2010/0176470 A1 | 7/2010 | Horng et al. | |
| 2013/0075839 A1 | 3/2013 | Chen et al. | |
| 2013/0221460 A1 | 8/2013 | Jan et al. | |
| 2016/0380188 A1 | 12/2016 | Hu | |
| 2020/0144494 A1 | 5/2020 | Jan et al. | |
| 2020/0158796 A1 | 5/2020 | Ikhtiar et al. | |

FOREIGN PATENT DOCUMENTS

| | | |
|---|---|---|
| KR | 10-2004-0078272 A | 9/2004 |
| KR | 10-2006-0123641 A | 12/2006 |

OTHER PUBLICATIONS

Extended European Search Report dated Apr. 3, 2023 issued in corresponding European Patent Application No. 22167361.9-1212.
U.S. Notice of Allowance dated Mar. 21, 2024 issued in co-pending U.S. Appl. No. 17/701,056.

* cited by examiner

FIG. 16

|  | COMPARATIVE | E1 | E2 | E3 | E4 | E5 | E6 |
|---|---|---|---|---|---|---|---|
| TMR (%) | 145 | 141 | 128 | 139 | 135 | 138 | 140 |
| Mst (uemu/cm2) | 195 | 132 | 152 | 123 | 124 | 141 | 140 |
| Hk (Oe) | 1398 | 3963 | 5420 | 6014 | 6796 | 5336 | 5299 |

MAGNETIC TUNNELING JUNCTION DEVICE AND MEMORY DEVICE INCLUDING THE SAME

CROSS-REFERENCE TO RELATED APPLICATION

This application is a continuation-in-part of U.S. application Ser. No. 17/701,056, filed on Mar. 22, 2022 in the United Stated Patent and Trademark Office, which claims priority from Korean Patent Application No. 10-2021-0093139, filed on Jul. 15, 2021, in the Korean Intellectual Property Office, the disclosure of each of which is incorporated by reference herein in its entirety.

BACKGROUND

The present disclosure relates to magnetic tunneling junction devices and/or memory devices including the magnetic tunneling junction devices.

A magnetic memory device such as a magnetic random access memory (MRAM) stores data by using a change in the resistance of a magnetic tunneling junction device. The resistance of the magnetic tunneling junction device varies with the magnetization direction of a free layer. For example, when the magnetization direction of the free layer is the same as the magnetization direction of a pinned layer, the magnetic tunneling junction device may have low resistance, and when the magnetization directions are opposite to each other, the magnetic tunneling junction device may have high resistance. When this characteristic is used in a memory device, for example, the magnetic tunneling junction device having low resistance may correspond to logical data '0' and the magnetic tunneling junction device having high resistance may correspond to logical data '1'.

Such a magnetic memory device may have advantages such as non-volatility, high-speed operation, and/or high durability. For example, Spin Transfer Torque-Magnetic RAM (STT-MRAM) that is currently mass-produced may have an operating speed of about 50 to 100 nsec and also have improved/excellent data retention greater than or equal to 10 years. In addition, research is underway to achieve a faster operating speed of less than 10 nsec.

SUMMARY

Provided are magnetic tunneling junction devices having a fast operating speed and/or memory devices including the magnetic tunneling junction devices.

Alternatively or additionally, provided are also magnetic tunneling junction devices having stable perpendicular magnetic anisotropy (PMA) while increasing an operating speed, and/or memory devices including the magnetic tunneling junction devices.

Additional aspects will be set forth in part in the description which follows and, in part, will be apparent from the description, or may be learned by practice of various example embodiments.

According to some example embodiments, a magnetic tunneling junction device includes a free layer having a first surface and a second surface opposite the first surface; a pinned layer facing the first surface of the free layer; a first oxide layer between the pinned layer and the free layer; and a second oxide layer on the second surface of the free layer. The free layer includes a magnetic material doped with a non-magnetic metal, the second oxide layer includes a metal oxide, and a metal in the metal oxide of the second oxide layer may be different from the non-magnetic metal of the free layer such that an oxygen affinity of the metal in the metal oxide of the second oxide layer is greater than an oxygen affinity of the non-magnetic metal of the free layer.

The magnetic material of the free layer may include at least one selected from the group consisting of or including Fe, Co, Ni, Mn, a Fe-containing alloy, a Co-containing alloy, a Ni-containing alloy, a Mn-containing alloy and a Heusler alloy.

The non-magnetic metal of the free layer may include at least one selected from the group consisting of or including Mo, V, W, Nb, Ta, Mg, Al, Zr, Cr, Hf, and Ge.

The metal in the metal oxide of the second oxide layer may include at least one metal element having an oxygen affinity greater than that of the non-magnetic metal of the free layer in the group consisting of or including Ta, Mg, Zr, Ti, Hf, Nb, Tb, Sc, Y, W, V, Al, and Zr.

The non-magnetic metal of the free layer may be molybdenum (Mo), and the metal in the metal oxide of the second oxide layer may include at least one metal element selected from the group consisting of or including Ta, Mg, Zr, Ti, Hf, Nb, Tb, Sc, Y, W, V, Al, and Zr The doping concentration of Mo in the free layer may be, for example, in a range of about 5 at % to about 20 at %.

The non-magnetic metal of the free layer may be tantalum (Ta), and the metal in the metal oxide of the second oxide layer may include at least one metal element selected from the group consisting of or including Ti, Al, Zr, Hf, Tb, Sc, and Y.

The non-magnetic metal of the free layer may include at least one metal element selected from the group consisting of or including Mg, Ru, Ir, Zn, Ga, Mo, Sn, W, Sb, V, Nb, Cr, Ge, Rh, and In, and the metal in the metal oxide of the second oxide layer may include at least one metal element selected from the group consisting of or including Ti, Ta, Al, Zr, Si, Hf, Tb, Sc, and Y.

The metal oxide of the second oxide layer may have an oxide formation energy greater than that of the oxide of the non-magnetic metal in the free layer.

A doping concentration of the non-magnetic metal in the free layer may be in the range of about 5 at % to about 50 at %.

The free layer may further include boron (B).

A boron concentration of the free layer is in the range of about 5 at % to about 50 at %.

The second oxide layer may further include boron absorbed from the free layer.

The first oxide layer may include a metal oxide having a stoichiometrically oxygen-deficient composition.

The first oxide layer may include a first region adjacent to the pinned layer and a second region adjacent to the free layer. A proportion of oxygen or nitrogen in the second region is greater than a proportion of oxygen or nitrogen in the first region.

The first oxide layer may further include a metal layer between the first region and the second region.

The second oxide layer may include a metal oxide having a stoichiometrically oxygen-deficient composition.

The free layer may includes a first free layer and a second free layer between the first free layer and the second oxide layer. The first free layer may includes at least one of CoFe, CoFeB, CoFeNiB, and FeB, the second free layer may includes the magnetic material doped with the non-magnetic metal, and the magnetic material in the second free layer may includes at least one of CoFe and CoFeB.

A thickness of the first free layer may be, for example, in a range of about 0.4 nm to about 0.8 nm, and a thickness of the second free layer may be, for example, in a range of about 0.4 nm to about 3 nm.

The second free layer may includes a non-magnetic metal layer interposed in the second free layer.

According to some example embodiments, a magnetic tunneling junction device includes a free layer having a first surface and a second surface opposite the first surface; a pinned layer facing the first surface of the free layer; a first oxide layer disposed between the pinned layer and the free layer; and a second oxide layer disposed on the second surface of the free layer, wherein the free layer includes a magnetic material doped with a non-magnetic metal, wherein the second oxide layer includes a metal oxide. The non-magnetic metal of the free layer includes at least one selected from the group consisting of or including Mo, V, W, Nb, Ta, Mg, Al, Zr, Cr, Hf, and Ge. The metal in the metal oxide of the second oxide layer includes at least one metal element having an oxygen affinity greater than that of the non-magnetic metal of the free layer, the at least one metal selected from the group consisting of or including Ta, Mg, Zr, Ti, Hf, Nb, Tb, Sc, Y, W, V, Al, and Zr.

According to some example embodiments, a magnetic tunneling junction device includes a free layer having a first surface and a second surface opposite the first surface; a pinned layer facing the first surface of the free layer; a first oxide layer between the pinned layer and the free layer; a second oxide layer on the second surface of the free layer; and a capping metal layer in contact with the second oxide layer. The free layer includes a magnetic material doped with a non-magnetic metal, and a metal in the capping metal layer may be different from the non-magnetic metal of the free layer such that the capping metal layer includes the metal having an oxygen affinity greater than an oxygen affinity of the non-magnetic metal of the free layer.

According to some example embodiments, a magnetic tunneling junction device includes a free layer having a first surface and a second surface opposite the first surface; a pinned layer facing the first surface of the free layer; a first oxide layer disposed between the pinned layer and the free layer; a second oxide layer on the second surface of the free layer; and a capping metal layer in contact with the second oxide layer. The free layer includes a magnetic material doped with a non-magnetic metal. The non-magnetic metal of the free layer includes at least one selected from the group consisting of or including Mo, V, W, Nb, Ta, Mg, Al, Zr, Cr, Hf, and Ge. The metal of the capping metal layer includes at least one metal element having an oxygen affinity greater than that of the non-magnetic metal of the free layer in the group consisting of or including Ta, Mg, Zr, Ti, Hf, Nb, Tb, Sc, Y, W, V, Al, and Zr.

According to some example embodiments, a memory device includes a plurality of memory cells each including a switching device connected to a magnetic tunneling junction device. The magnetic tunneling junction device includes a free layer having a first surface and a second surface opposite the first surface; a pinned layer facing the first surface of the free layer; a first oxide layer disposed between the pinned layer and the free layer; and a second oxide layer disposed on the second surface of the free layer. The free layer includes a magnetic material doped with a non-magnetic metal. The second oxide layer includes a metal oxide. A metal in the metal oxide of the second oxide layer may be different from the non-magnetic metal of the free layer such that an oxygen affinity of the metal in the metal oxide of the second oxide layer is greater than an oxygen affinity of the non-magnetic metal of the free layer.

According to some example embodiments, a memory device includes a plurality of memory cells each including a switching device connected to a magnetic tunneling junction device. The magnetic tunneling junction device includes a free layer having a first surface and a second surface opposite the first surface; a pinned layer facing the first surface of the free layer; a first oxide layer between the pinned layer and the free layer; a second oxide layer on the second surface of the free layer; and a capping metal layer disposed in contact with the second oxide layer. The free layer includes a magnetic material doped with a non-magnetic metal, and a metal in the capping metal layer may be different from the non-magnetic metal of the free layer such that the capping metal layer includes the metal having an oxygen affinity greater than an oxygen affinity of the non-magnetic metal of the free layer.

BRIEF DESCRIPTION OF THE DRAWINGS

The above and other aspects, features, and advantages of certain example embodiments of the disclosure will be more apparent from the following description taken in conjunction with the accompanying drawings, in which:

FIG. 16 shows a table regarding various characteristics of some example embodiments and a comparative example;

DETAILED DESCRIPTION

Figure 1:
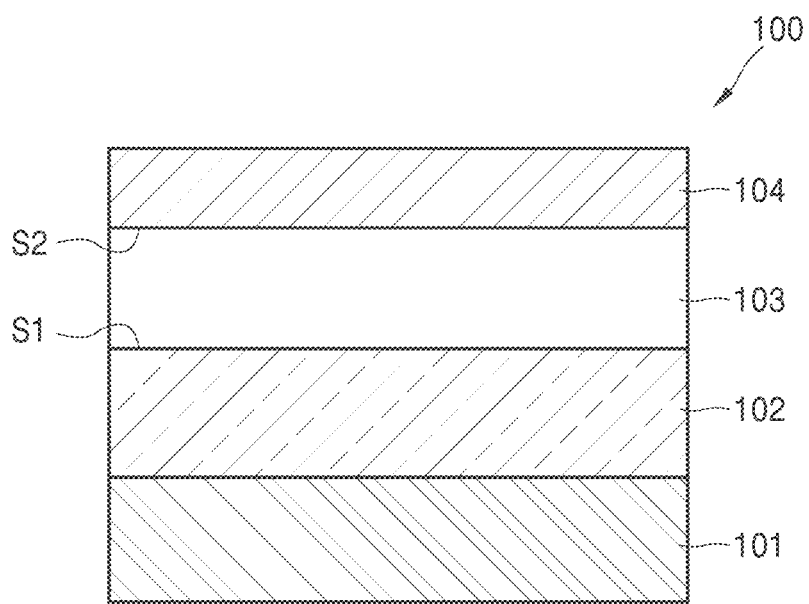
FIG. 1 is a cross-sectional view illustrating a schematic structure of a magnetic tunneling junction device according to some example embodiments.

Reference will now be made in detail to various example embodiments, examples of which are illustrated in the accompanying drawings, wherein like reference numerals refer to like elements throughout. In this regard, various embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, with reference to the accompanying drawings, a magnetic tunneling junction device and/or a memory device including the magnetic tunneling junction device will be described in detail. Like reference numerals refer to like elements throughout, and in the drawings, sizes of elements may be exaggerated for clarity and convenience of explanation. Various embodiments described below are merely by example, and various modifications may be possible from the embodiments.

In a layer structure described below, an expression "above" or "on" may include not only "immediately on in a contact manner" but also "on in a non-contact manner". An expression used in the singular encompasses the expression of the plural, unless it has a clearly different meaning in the context. It will be further understood that the terms "comprises" and/or "comprising" used herein specify the presence of stated features or elements, but do not preclude the presence or addition of one or more other features or elements.

The use of "the" and other demonstratives similar thereto may correspond to both a singular form and a plural form. Unless the order of operations of a method according to the present disclosure is explicitly mentioned or described otherwise, the operations may be performed in a proper order. The present disclosure is not limited to the order the operations are mentioned.

The term used in the embodiments such as "unit" or "module" indicates a unit for processing at least one function or operation, and may be implemented in hardware or software, or in a combination of hardware and software.

The connecting lines, and/or connectors shown in the various figures presented are intended to represent functional relationships and/or physical and/or logical couplings between the various elements. It should be noted that many alternative and/or additional functional relationships, physical connections and/or logical connections may be present in a practical device.

The use of any and all examples, or language provided herein, is intended merely to better illuminate the disclosure and does not pose a limitation on the scope of the disclosure unless otherwise claimed.

FIG. 1 is a cross-sectional view illustrating a schematic structure of a magnetic tunneling junction device 100 according to some example embodiments. Referring to FIG. 1, the magnetic tunneling junction device 100 according to some example embodiments may include a pinned layer 101, a first oxide layer 102 disposed on the pinned layer 101, a free layer 103 disposed on the first oxide layer 102, and a second oxide layer 104 disposed on the free layer 103.

Here, the expression "disposed on" is for convenience of description and does not necessarily mean a vertical relationship. For example, the first oxide layer 102 may be disposed between the pinned layer 101 and the free layer 103, and the free layer 103 may be disposed between the first oxide layer 102 and the second oxide layer 104. Also, the free layer 103 may include a first surface S1 and a second surface S2 that face each other. The pinned layer 101 may be disposed to face the first surface S1 of the free layer 103, and the second oxide layer 104 may be disposed on the second surface S2 of the free layer 103.

The pinned layer 101 and the free layer 103 may include a ferromagnetic metal material having magnetism/magnetic properties. For example, the pinned layer 101 and the free layer 103 may include at least one ferromagnetic material selected from the group consisting of or including iron (Fe), cobalt (Co), nickel (Ni), manganese (Mn), a Fe-containing alloy, a Co-containing alloy, a Ni-containing alloy, an Mn-containing alloy and a Heusler alloy. The pinned layer 101 and the free layer 103 may include the same magnetic material, but are not limited thereto.

The pinned layer 101 may have a pinned magnetization direction, and the free layer 103 may have a variable magnetization direction. The magnetization direction of the free layer 103 may be changed due to a spin torque induced by a spin-polarized current applied to the free layer 103. The magnetic tunneling junction device 100 may have a relatively low resistance when the pinned layer 101 and the free layer 103 have the same magnetization direction (e.g. are parallel), and a relatively high resistance when the magnetization directions are opposite (e.g. are anti-parallel). This phenomenon is called tunneling magnetoresistance (TMR). The magnetic tunneling junction device 100 may be used in a memory device by applying this TMR phenomenon.

The pinned layer 101 and the free layer 103 may have high perpendicular magnetic anisotropy (PMA). For example, the perpendicular magnetic anisotropy energy of the pinned layer 101 and the free layer 103 may exceed out-of-plane demagnetization energy. In this case, the magnetic moments of the pinned layer 101 and the free layer 103 may be stabilized in a direction perpendicular to a layer direction. The magnetic tunneling junction device 100 may be applied to STT-MRAM. Alternatively or additionally, the magnetic tunneling junction device 100 may be applied not only to STT-MRAM but also to spin-orbit coupling torque (SOT) MRAM.

The operating speed of the memory device using the magnetic tunneling junction device 100 is affected by the saturation magnetization Ms of the free layer 103. For example, as the saturation magnetization Ms is low, the magnetization direction of the free layer 103 may be easily changed even with a low current, and the operating speed of the memory device may be increased. According to some example embodiments, the free layer 103 may include a magnetic material doped with a non-magnetic metal so as to reduce the saturation magnetization Ms. For example, the free layer 103 may include CoFeX, CoX, or CoFeX doped with a non-magnetic metal (X). The non-magnetic metal (X) may include at least one metal selected from the group consisting of or including, for example, Mo, V, W, Nb, Ta, Mg, Al, Zr, Cr, Hf, and Ge. The doping concentration of the non-magnetic metal X in the free layer 103 may be, for example, in a range of about 5 at % to about 50 at %. In particular, when the free layer 103 is doped with is molybdenum (Mo), the doping concentration of the non-magnetic metal in the free layer may be, for example, in a range of about 5 at % to about 20 at %. The free layer 103 may include various the other ferromagnetic materials described above in addition to Fe, Co, and CoFe. Alternatively or additionally, in order to improve a wetting property of the free layer 103 during a manufacturing process that will be described later, the free layer 103 may further include boron (B). For example, the free layer 103 may include one or more of FeBX, CoBX, or CoFeBX (where X is a non-magnetic metal).

The first oxide layer 102 disposed between the pinned layer 101 and the free layer 103 may serve as a tunnel barrier layer for a magnetic tunneling junction. The first oxide layer 102 may include crystalline Mg oxide. For example, the first oxide layer 102 may include at least one oxide material selected from the group consisting of MgO, MgAl$_2$O$_4$, and MgTiO$_x$, where x is a stoichiometric amount of oxygen.

The second oxide layer 104 disposed on the second surface S2 of the free layer 103 may serve as a capping layer. In addition, when the second oxide layer 104 is used, interface perpendicular magnetic anisotropy (IPMA) is generated by hybridization of 3d orbital of a ferromagnetic element and 2p orbital of oxygen at an interface between the first oxide layer 102 and the free layer 103 and at an interface between the second oxide layer 104 and the free layer 103. The IPMA is generated at both interfaces of the free layer 103 using the second oxide layer 104, and thus the intensity of IPMA may be increased.

However, the intensity of the IPMA may also vary depending on a type of non-magnetic metal doped into the free layer 103. For example, when an oxygen affinity of the non-magnetic metal is greater than an oxygen affinity of a magnetic material in the free layer 103 such as Fe, the IPMA may be weakened. The intensity of the IMPA may increase as the free layer 103 and the second oxide layer 104 are clearly separated at the interface. When the non-magnetic metal in the free layer 103 has a high oxygen affinity, oxygen atoms of the second oxide layer 104 are not fixed to the second oxide layer 104 and may inter-diffuse at an interface between the free layer 103 and the second oxide layer 104. Due to this inter-diffusion, the interface between the free layer 103 and the second oxide layer 104 may not be clearly maintained, which may result in the weakening of the intensity of IMPA.

Accordingly, in order to prevent or reduce the likelihood of and/or impact from the weakening of the IPMA due to the non-magnetic metal in the free layer 103, the second oxide layer 104 may include ZO$_x$ which is an oxide of a metal (Z) having an oxygen affinity greater than that of the non-magnetic metal in the free layer 103. For example, the oxide (ZO$_x$) of the second oxide layer 104 may be more stable than the oxide (XO$_x$) of the non-magnetic metal (X) in the free layer 103. For example, the oxide (ZO$_x$) of the second oxide layer 104 may have an oxide formation energy greater than that of the oxide (XO$_x$) of the non-magnetic metal in the free layer 103. Then, diffusion of oxygen atoms in the second oxide layer 104 into the free layer 103 may be prevented or reduced in amount of or likelihood of occurrence, and thus a high IPMA may be more secured.

For example, the metal (Z) for in the metal oxide of the second oxide layer 104 may include at least one metal element selected from the group consisting of or including Ta, Mg, Zr, Ti, Hf, Nb, Tb, Sc, Y, W, V, Al, and Zr. The metal (Z) used in the metal oxide of the second oxide layer 104 may be selected in consideration of the non-magnetic metal in the free layer 103 such that the metal (Z) used in the metal oxide of the second oxide layer 104 may be different from the non-magnetic metal in the free layer 103. For example, among the metals mentioned above, a metal having an oxygen affinity greater than that of the non-magnetic metal in the free layer 103 may be selected as the metal (Z) used in the metal oxide of the second oxide layer 104. According to a type of the non-magnetic metal in the free layer 103, an oxide material of the second oxide layer 104 may be different from an oxide material of the first oxide layer 102.

The non-magnetic metal of the free layer 103 and the metal (Z) of the second oxide layer 104 satisfying the above conditions may be selected from among a wide variety of combinations. For example, when the free layer 103 is doped with aluminum (Al), the metal (Z) of the second oxide layer 104 may include at least one metal element selected from the group consisting of or including Ti, Zr, Hf, Tb, Sc, and Y. When the free layer 103 is doped with molybdenum (Mo), the metal (Z) of the second oxide layer 104 may include at least one metal element selected from the group consisting of or including Ta, Mg, Zr, Ti, Hf, Nb, Tb, Sc, Y, W, V, Al, and Zr. When the free layer 103 is doped with tantalum (Ta), the metal (Z) of the second oxide layer 104 may include at least one metal element selected from the group consisting of or including Ti, Al, Zr, Hf, Tb, Sc, and Y. Alternatively or additionally, when the free layer 103 is doped with at least one non-magnetic metal selected from the group consisting of or including V, W, Nb, Mg, Cr, and Ge, the metal (Z) of the second oxide layer 104 may include at least one metal element selected from the group consisting of or including Ta, Zr, Ti, Hf, Tb, Sc, Y, Al, and Zr.

When the non-magnetic metal of the free layer 103 and the metal (Z) of the second oxide layer 104 satisfy the above-described conditions, the operating speed of the magnetic tunneling junction device 100 may be improved. For example, the operating speed or switching speed of a memory device including the magnetic tunneling junction device 100 according to some example embodiments may be less than or equal to 10 nsec. In addition, the interdiffusion of oxygen may be prevented or reduced in likelihood or amount at the interface between the free layer 103 and the second oxide layer 104, and thus the free layer 103 may have stable PMA.

FIGS. 2A to 2E are cross-sectional views illustrating a process of manufacturing the magnetic tunneling junction device 100 shown in FIG. 1. Hereinafter, a method of manufacturing the magnetic tunneling junction device 100 shown in FIG. 1 will be described with reference to FIGS. 2A to 2E.

Figure 2A:
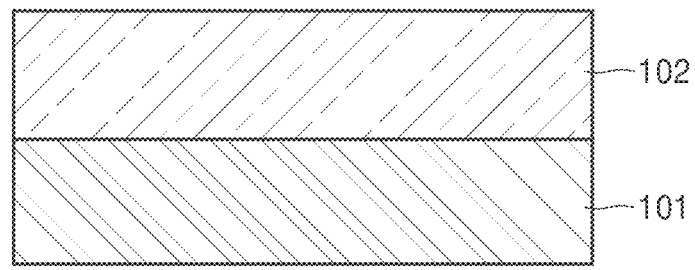
FIGS. 2A to 2E are cross-sectional views illustrating a process of manufacturing the magnetic tunneling junction device shown in FIG. 1 according to some example embodiments.

Referring to FIG. 2A, the first oxide layer 102 is formed on the pinned layer 101 by depositing an oxide such as one or more of MgO, MgAl$_2$O$_4$, or MgTiO$_x$. For example, the first oxide layer 102 may be formed through radio frequency (RF) sputtering. Alternatively or additionally, the first oxide layer 102 may be formed by first depositing a metal material of oxide on the pinned layer 101 and then oxidizing the metal material. For example, MgO may be formed by first depositing Mg on the pinned layer 101 and then oxidizing (e.g., thermally oxidizing) Mg.

After the first oxide layer 102 is formed, the pinned layer 101 and the first oxide layer 102 are cooled to a low temperature. In general, the material of the first oxide layer 102 may have a relatively low surface energy, while the metal material of the free layer 103 may have a relatively high surface energy. For this reason, when the free layer 103 is formed on the first oxide layer 102, the metal material may not be evenly distributed on a surface of the first oxide layer 102. This problem may be improved by lowering the temperature of the first oxide layer 102 to deteriorate the mobility of the metal material. For example, the first oxide layer 102 may be cooled to a temperature equal to or less than about 250 K, or about 50 K to about 150 K, or about 70 K to about 100 K.

Figure 2B:
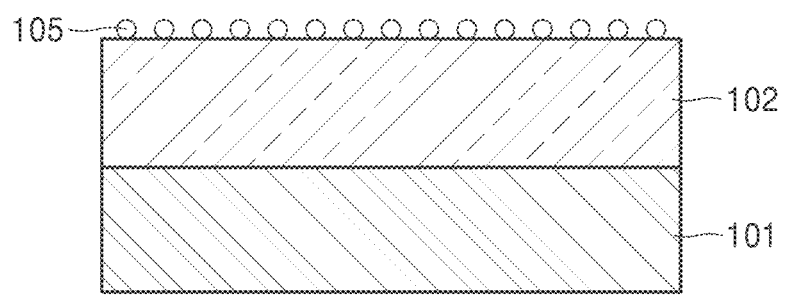

Referring to FIG. 2B, before forming the free layer 103, a wetting layer 105 may be first formed on the first oxide layer 102. The wetting layer 105 may serve to help deposit the free layer 103 on the first oxide layer 102 by increasing the surface energy of the first oxide layer 102. The wetting layer 105 may be formed by using a method such as one or more of sputtering, physical vapor deposition (PVD), etc. The wetting layer 105 may be used as a precursor with respect to the free layer 103. To this end, the wetting layer 105 may include a 3d transition metal and/or an alloy thereof. For example, the wetting layer 105 may include at least one material selected from the group consisting of or including Fe, Co, Ni, Mn, a Fe-containing alloy, a Co-containing alloy, a Ni-containing alloy, and a Mn-containing alloy.

The wetting layer 105 may have a very thin thickness. For example, the wetting layer 105 may include only two or three monolayers. Although the wetting layer 105 may be distributed substantially uniformly on the first oxide layer 102, because the wetting layer 105 has a very thin thickness, it is not necessary to have a completely smooth and/or continuous distribution, and a void may be partially inside the wetting layer 105.

Figure 2C:
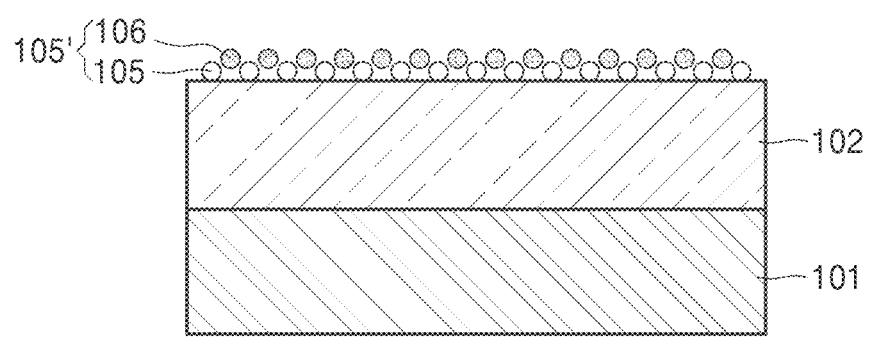

Referring to FIG. 2C, oxygen and/or nitrogen atoms 106 may be combined with the wetting layer 105 by oxidizing and/or nitrating the wetting layer 105. For example, the wetting layer 105 may be naturally (natively) oxidized, and/or other oxidation methods such as controlled methods such as reactive oxidation may be used. Alternatively or additionally, the wetting layer 105 may be nitrated naturally and/or through an intentional reaction. This oxidation/nitration reaction may be performed until a target resistance area (RA) product is achieved. Although the wetting layer 105 may be completely oxidized and/or nitrated through the oxidation/nitration reaction, the oxidation/nitration reaction may be terminated while the wetting layer 105 is not completely oxidized/nitrated. As a result, an oxidized/nitrated wetting layer 105' is formed on the first oxide layer 102.

Figure 2D:
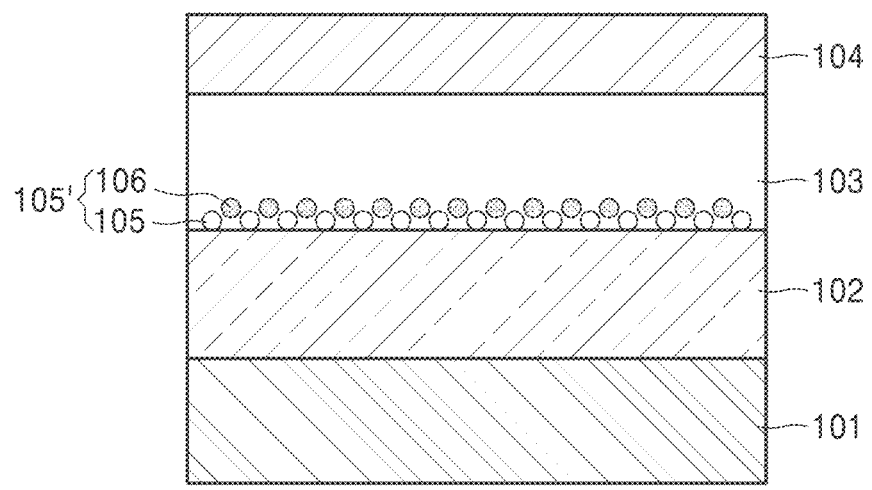

Referring to FIG. 2D, a free layer 103 may be deposited on the oxidized/nitrated wetting layer 105'. In order to form the free layer 103 on the oxidized/nitrated wetting layer 105', for example, at least one of 3d transition metals such as iron (Fe), cobalt (Co), nickel (Ni), and manganese (Mn), 3d transition metal alloys such as Fe-containing alloy, Co-containing alloy, Ni-containing alloy, and Mn-containing alloy, or Heusler alloy such as $Co_2Fe$, $Co_2MnSi$, $Co_2FeMnSi$, $Co_2FeSi$, MnGa, MnGe, etc. may be deposited. In addition, the free layer 103 may be doped with at least one non-magnetic metal selected from the group consisting of or including Mo, V, W, Nb, Ta, Mg, Al, Zr, Cr, Hf, and Ge. A doping concentration of the non-magnetic metal in the free layer 103 may be in the range of, for example, about 5 at % to about 50 at %. When the free layer 103 is doped with is molybdenum (Mo), the doping concentration of the non-magnetic metal in the free layer may be, for example, in a range of about 5 at % to about 20 at %.

If necessary and/or desirable, when the free layer 103 is formed, boron may be further provided in a chamber such as a plasma chamber. Boron may facilitate the formation of the free layer 103 on the first oxide layer 102 by reducing the surface energy of the free layer 103. A doping concentration of boron in the free layer 103 may be in the range of, for example, about 5 at % to about 50 at %.

In an operation of forming the free layer 103, the first oxide layer 102 may still be in a cryogenic cooling state. This may be because a time from cooling the first oxide layer 102 to depositing the free layer 103 may be considerably shorter than a time taken for the temperature of the first oxide layer 102 to naturally rise to room temperature Even though the temperature of the first oxide layer 102 naturally rises, the temperature of the first oxide layer 102 in the operation of forming the free layer 103 may be equal to or less than 300 K, for example, equal to or less than 250 K. Alternatively or additionally, when the deposition of the free layer 103 starts, the temperature of the first oxide layer 102 may be equal to or less than 200 K. If necessary, additional cooling may be performed before depositing the free layer 103 after forming the oxidized/nitrated wetting layer 105'.

After the free layer 103 is formed, a second oxide layer 104 may be further formed on the free layer 103. The second oxide layer 104 may be formed by an RF sputtering method, and/or may be formed by first depositing a metal material of an oxide on the free layer 103 and then oxidizing the metal material. As described above, a metal material for forming a metal oxide of the second oxide layer 104 may be selected in consideration of the non-magnetic metal in the free layer 103. For example, the second oxide layer 104 may be formed by selecting at least one metal element having an oxygen affinity greater than that of the non-magnetic metal in the free layer 103 from among Ta, Mg, Zr, Ti, Hf, Nb, Tb, Sc, Y, W, V, Al, and Zr.

Figure 2E:
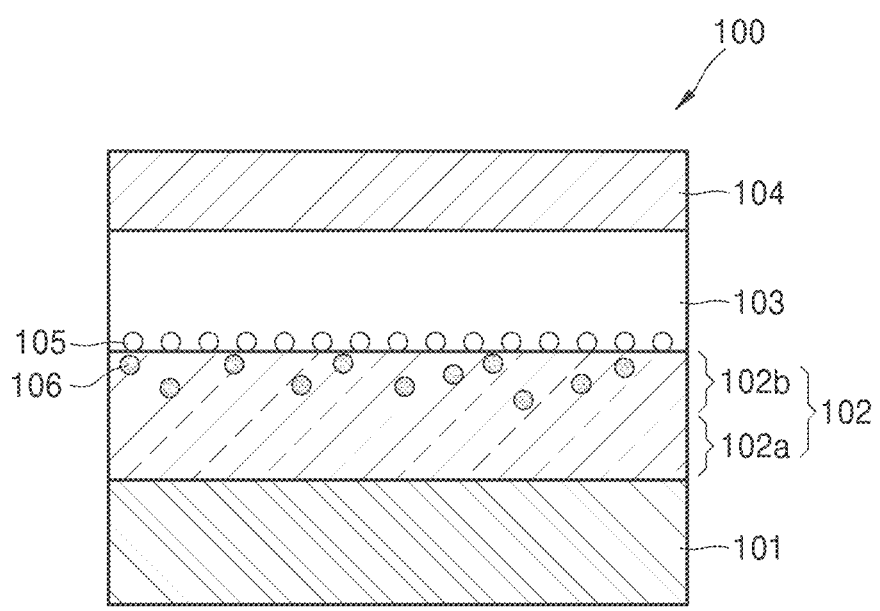

Referring to FIG. 2E, in order to improve the crystallinity of the free layer 103, the free layer 103 may be annealed at a temperature equal to or higher than a room temperature (300 K). For example, rapid thermal annealing (RTA) may be performed. During an annealing process, oxygen or nitrogen atoms 106 combined with the oxidized/nitrated wetting layer 105' may diffuse into the first oxide layer 102. The wetting layer 105 from which the oxygen or nitrogen atoms 104 have escaped may be fused into the free layer 103 to be virtually indistinguishable from the free layer 103. The oxygen or nitrogen atoms 106 in the oxidized/nitrated wetting layer 105' may diffuse into the first oxide layer 102 so that a proportion of oxygen or nitrogen in a region of the first oxide layer 102 adjacent to the free layer 103 may increase. Accordingly, after the operation shown in FIG. 2E, the first oxide layer 102 may include a first region 102a adjacent to the pinned layer 101 and a second region 102b adjacent to the free layer 103, and a proportion of oxygen or nitrogen in the second region 102b may be greater than a respective proportion of oxygen or nitrogen in the first region 102a.

In some example embodiments, the first oxide layer 102 may include a metal oxide having a stoichiometrically oxygen-deficient composition so as to more easily trap oxygen and/or nitrogen generated in an annealing process. For example, when the first oxide layer 102 includes MgO, a proportion of magnesium (Mg) in the first oxide layer 102 may be greater than 50 at % and a proportion of oxygen (O) in the first oxide layer 102 may be less than 50 at %. In other words, the first oxide layer 102 may be formed so as to have an oxygen-deficient composition compared to an inherent oxygen composition of an oxide material in the first oxide layer 102.

When the free layer 103 further includes boron, boron in the free layer 103 may be diffused into the second oxide layer 104 during the annealing process. In this case, the second oxide layer 104 may further include boron diffused from the free layer 103. For example, when the metal material of the oxide is Z, the second oxide layer 104 after annealing may include ZBOx. In particular, when the second oxide layer 104 includes at least one selected from the group consisting of or including $HfO_x$, $NbO_x$, $TaO_x$, and $WO_x$, the second oxide layer 104 may easily absorb boron in the free layer 103 and thus the boron concentration of the free layer 103 may be significantly reduced. When the boron concentration of the free layer 103 is reduced, the switching efficiency of the magnetic tunneling junction device 100 may be improved.

In addition, during the annealing process, boron in the free layer 103 diffuses into the second oxide layer 104, so that the concentration of boron in the free layer 103 is not constant and may change gradually and/or continuously. For example, the concentration of boron in the free layer 103 may be peaked, or at a local or global maximum, at an interface with the first oxide layer 102. The concentration of boron in the free layer 103 may be gradually reduced toward the second oxide layer 104 and be low, e.g. at a minimum at an interface with the second oxide layer 104.

Figure 3:
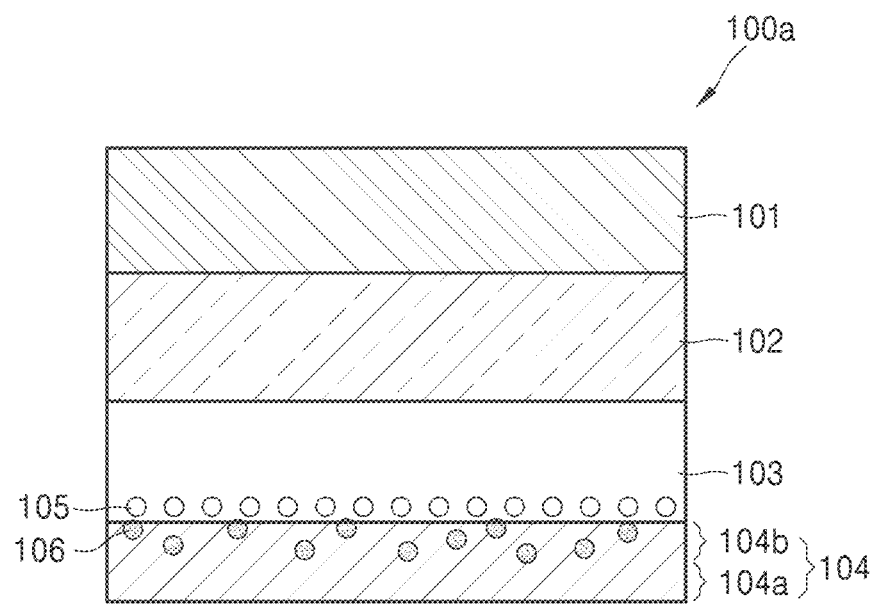
FIG. 3 is a cross-sectional view illustrating a schematic structure of a magnetic tunneling junction device according to some example embodiments.

FIG. 3 is a cross-sectional view showing a schematic structure of a magnetic tunneling junction device 100a according to some example embodiments. In FIGS. 2A to 2E, the first oxide layer 102, the free layer 103, and the second oxide layer 104 are sequentially stacked on the pinned layer 101. However, a manufacturing process of the magnetic tunneling junction device 100 is not necessarily limited thereto. For example, referring to FIG. 3, the magnetic tunneling junction device 100a may be manufactured/fabricated by sequentially stacking the free layer 103, the first oxide layer 102, and the pinned layer 101 on/onto the second oxide layer 104. The magnetic tunneling junction device 100a shown in FIG. 3 differs from the magnetic tunneling junction device 100 shown in FIG. 1 only in the stacking order, and other configurations may be substantially similar.

In the process of manufacturing/fabricating the magnetic tunneling junction device 100a shown in FIG. 3, the wetting layer 105 and the oxygen and/or nitrogen atoms 106 bonded to the wetting layer 105 may be formed on an upper surface of the second oxide layer 104. In addition, oxygen and/or nitrogen generated during an annealing process may diffuse into the second oxide layer 104. In this case, the second oxide layer 104 may include a first region 104a having a relatively low oxygen and/or nitrogen ratio and a second region 104b having a relatively high oxygen and/or nitrogen ratio. The second region 104b is a region disposed adjacent to the second free layer 103b. In order to more easily capture oxygen or nitrogen, the second oxide layer 104 may include a metal oxide having a stoichiometrically oxygen-deficient composition.

Figure 4:
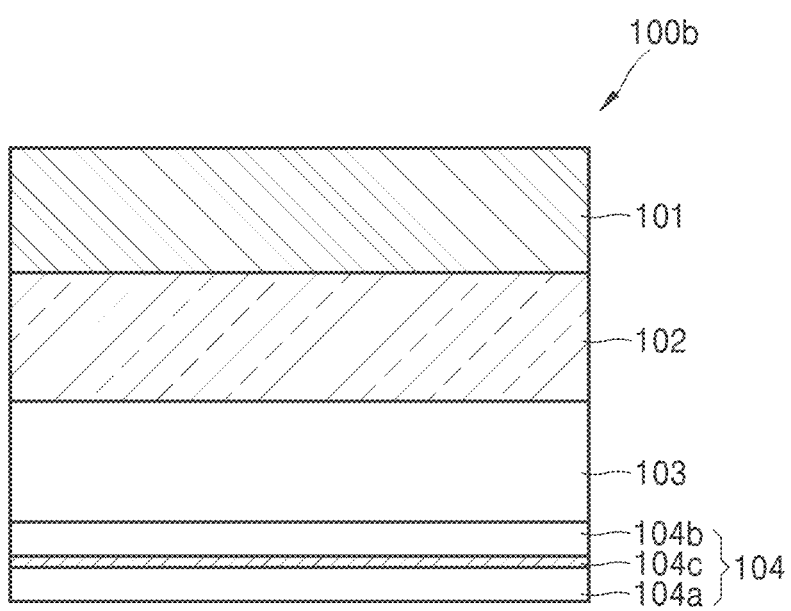
FIG. 4 is a cross-sectional view illustrating a schematic structure of a magnetic tunneling junction device according to some example embodiments.

FIG. 4 is a cross-sectional view showing a schematic structure of a magnetic tunneling junction device 100b according to some example embodiments. Referring to FIG. 4, the magnetic tunneling junction device 100b may include the second oxide layer 104, the free layer 103 disposed on the second oxide layer 104, the first oxide layer 102 disposed on the free layer 103, and the pinned layer 101 disposed on the first oxide layer 102. The second oxide layer 104 may further include a metal layer 104c therein to more easily trap oxygen or nitrogen generated during an annealing process. For example, the second oxide layer 104 includes the first region 104a having a relatively low oxygen or nitrogen ratio, the second region 104b having a relatively high oxygen or nitrogen ratio, and a metal layer 104c disposed between the first region 104a and the second region 104b.

Due to the metal layer 104c, the second oxide layer 104 may trap more oxygen and/or nitrogen atoms, and further reduce oxygen and/or nitrogen atoms diffusing into the free layer 103. In particular, even when a non-magnetic metal doped in the free layer 103 has an oxygen affinity greater than that of a ferromagnetic material, oxygen and/or nitrogen atoms may diffuse into the second oxide layer 104 without diffusing into the free layer 103. Accordingly, an increase in a resistance area (RA) product of the magnetic tunneling junction device 100b due to the oxygen or nitrogen atoms diffused into the free layer 103 may be prevented. The metal layer 104c shown in FIG. 4 may also be applied to the first oxide layer 102 of the magnetic tunneling junction device 100 shown in FIG. 1.

Figure 5:
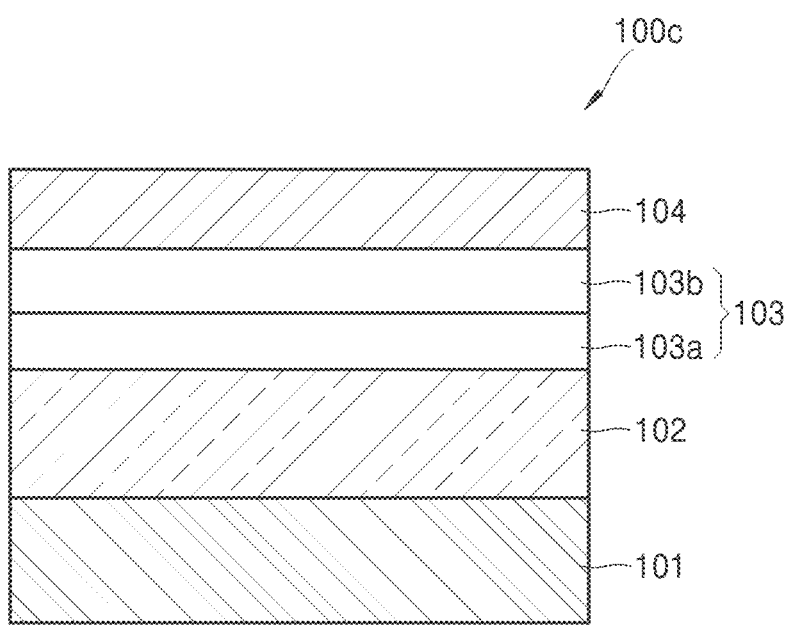
FIG. 5 is a cross-sectional view illustrating a schematic structure of a magnetic tunneling junction device according to some example embodiments.

FIG. 5 is a cross-sectional view showing a schematic structure of a magnetic tunneling junction device 100c according to some example embodiments. Referring to FIG. 5, the magnetic tunneling junction device 100c may include the pinned layer 101, the first oxide layer 102 disposed on the pinned layer 101, the free layer 103 disposed on the first oxide layer 102, and the second oxide layer 104 disposed on the free layer 103. The free layer 103 may include a first free layer 103a disposed on the first oxide layer 102 and a second free layer 103b disposed on the first free layer 103a. The second oxide layer 104 may be disposed on the second free layer 103b. The first free layer 103a may include a magnetic material which is not doped with a non-magnetic metal. For example, the magnetic material in the first free layer 103a may include at least one of CoFe, CoFeB, CoFeNiB, and FeB. The second free layer 103b may include a magnetic material doped with a non-magnetic metal. For example, the magnetic material in the second free layer 103b may include at least one of CoFe and CoFeB doped with the non-magnetic metal (X). A thickness of the first free layer 103a may be, for example, in a range of about 0.4 nm to about 0.8 nm, and a thickness of the second free layer 103b may be, for example, in a range of about 0.4 nm to about 3 nm.

Figure 6:
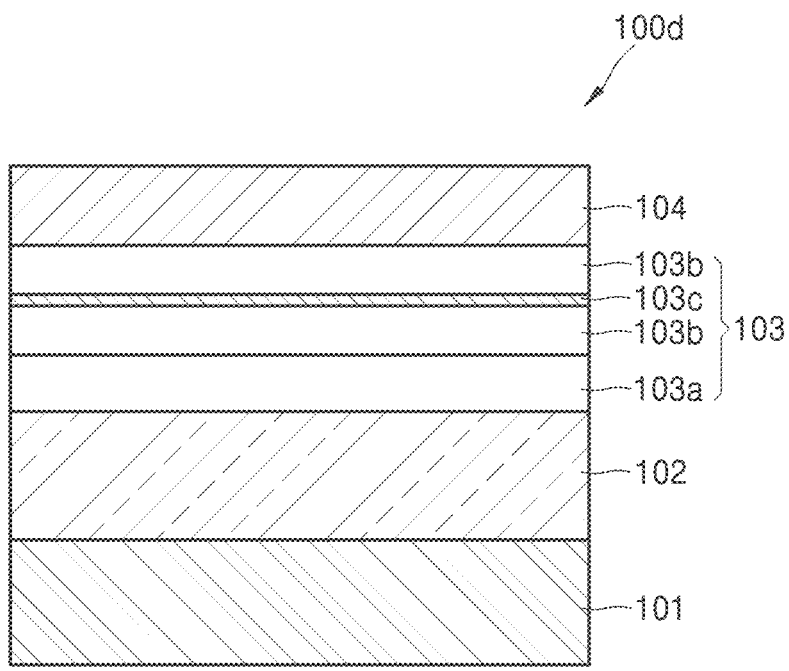
FIG. 6 is a cross-sectional view illustrating a schematic structure of a magnetic tunneling junction device according to some example embodiments.

FIG. 6 is a cross-sectional view showing a schematic structure of a magnetic tunneling junction device 100d according to some example embodiments. Referring to FIG. 6, the free layer 103 of the magnetic tunneling junction device 100d may further include a non-magnetic metal layer 103c interposed in the second free layer 103b. The second free layer 103b may be divided by the non-magnetic metal layer 103c into two portions such that a lower portion of the second free layer 103b is in contact with a lower surface of the non-magnetic metal layer 103c and an upper portion of the second free layer 103b is in contact with an upper surface of the non-magnetic metal layer 103c. The non-magnetic metal layer 103c may include, for example, Mo, V, W, Nb, Ta, Mg, Al, Zr, Cr, Hf, and Ge. In particular, the non-magnetic metal layer 103c may include the same non-magnetic metal as doped in the second free layer 103b. For example, when the second free layer 103b is doped with molybdenum (Mo), the non-magnetic metal layer 103c may include molybdenum (Mo). A thickness of the non-magnetic metal layer 103c may be may be smaller than the thickness of the first free layer 103a and the thickness of the second free layer 103b. For example, the non-magnetic metal layer 103c may include at least one molecule layer of a non-magnetic metal element.

Figure 7:
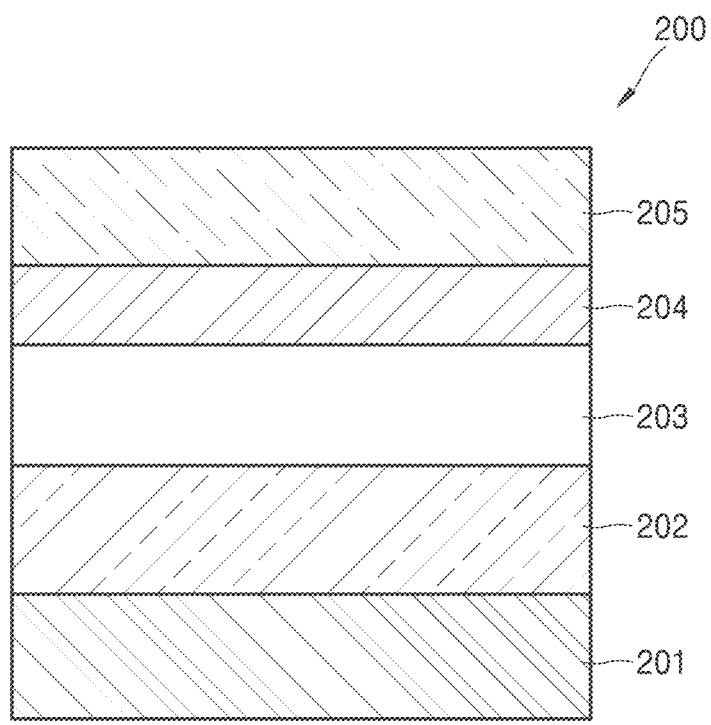
FIG. 7 is a cross-sectional view illustrating a schematic structure of a magnetic tunneling junction device according to some example embodiments.

FIG. 7 is a cross-sectional view showing a schematic structure of a magnetic tunneling junction device 200 according to some example embodiments. Referring to FIG. 7, the magnetic tunneling junction device 200 may include a pinned layer 201, a first oxide layer 202 disposed on the pinned layer 201, a free layer 203 disposed on the first oxide layer 202, a second oxide layer 204 disposed on the free layer 203, and a capping metal layer 205 disposed on and in contact with the second oxide layer 204. The pinned layer 201, the first oxide layer 202, and the free layer 203 of the magnetic tunneling junction device 200 shown in FIG. 7 have the same configurations and/or arrangements as those of the pinned layer 101, the first oxide layer 102, and the free layer 103 of the magnetic tunneling junction device 100 shown in FIG. 1.

The second oxide layer 204 may include the same oxide material as the first oxide layer 202, unlike the second oxide layer 104 of the magnetic tunneling junction device 100 shown in FIG. 1. For example, the second oxide layer 204 may include at least one oxide material selected from the group consisting of or including MgO, $MgAl_2O_4$, or $MgTiO_x$.

The capping metal layer 205 disposed on the second oxide layer 204 may prevent or reduce oxygen atoms in the second oxide layer 204 from diffusing into the free layer 203 due to a non-magnetic metal in the free layer 203. To this end, the capping metal layer 205 may include a metal having an oxygen affinity greater than that of the non-magnetic metal in the free layer 203. Then, oxygen atoms in the second oxide layer 204 may tend to move toward the capping metal layer 205 rather than the free layer 203, which may suppress oxygen atoms from diffusing into the free layer 203.

A metal used in the capping metal layer 205 may be the same as a metal material for forming a metal oxide of the second oxide layer 104 shown in FIG. 1. For example, the metal used in the capping metal layer 205 may include at least one metal element selected from the group consisting of or including Ta, Mg, Zr, Ti, Hf, Nb, Tb, Sc, Y, W, V, Al, and Zr. A metal material of the capping metal layer 205 may be selected in consideration of the non-magnetic metal in the free layer 203. In particular, among the metals mentioned above, a metal having an oxygen affinity greater than that of the non-magnetic metal in the free layer 203 may be selected as the metal material of the capping metal layer 205.

The non-magnetic metal of the free layer 203 and the metal of the capping metal layer 205 satisfying the above conditions may be selected from among a wide variety of combinations. For example, when the free layer 203 is doped with aluminum (Al), the metal of the capping metal layer 205 may include at least one metal element selected from the group consisting of or including Ti, Zr, Hf, Tb, Sc, and Y. When the free layer 203 is doped with molybdenum (Mo), the metal of the capping metal layer 205 may include at least one metal element selected from the group consisting of or including Ta, Mg, Zr, Ti, Hf, Nb, Tb, Sc, Y, W, V, Al, and Zr. When the free layer 203 is doped with tantalum (Ta), the metal of the capping metal layer 205 may include at least one metal element selected from the group consisting of Ti, Al, Zr, Hf, Tb, Sc, and Y. Alternatively or additionally, when the free layer 203 is doped with at least one non-magnetic metal selected from the group consisting of or including V, W, Nb, Mg, Cr, and Ge, the metal of the capping metal layer 205 may include at least one metal element selected from the group consisting of or including Ta, Zr, Ti, Hf, Tb, Sc, Y, Al, and Zr.

In order for the capping metal layer 205 to sufficiently suppress diffusion of oxygen atoms in the second oxide layer 204, a thickness of the capping metal layer 205 may be greater than that of the second oxide layer 204. For example, the thickness of the second oxide layer 204 is in the range of about 0.5 nm to about 2 nm. The thickness of the capping metal layer 205 is in the range of about 1 nm to about 5 nm. Meanwhile, a thickness of the free layer 203 is in the range of about 1 nm to about 4 nm.

Figure 8:
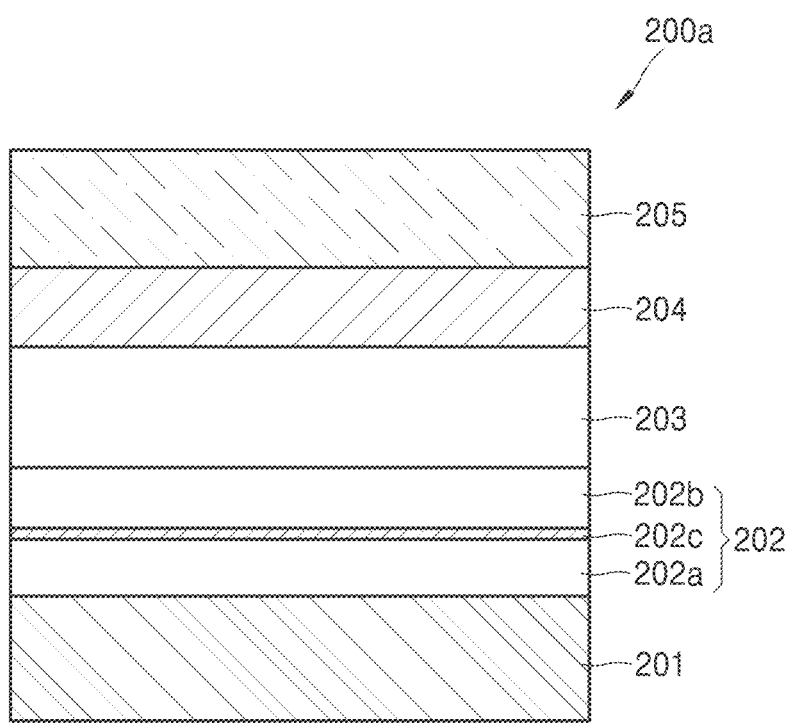
FIG. 8 is a cross-sectional view illustrating a schematic structure of a magnetic tunneling junction device according to some example embodiments.

FIG. 8 is a cross-sectional view showing a schematic structure of a magnetic tunneling junction device 200a according to some example embodiments. The magnetic tunneling junction device 200a shown in FIG. 8 is different from the magnetic tunnel junction device 200 shown in FIG. 7 only in the configuration of the first oxide layer 202 and is the same in the other configuration. The first oxide layer 202 of the magnetic tunneling junction device 200a may include a first region 202a adjacent to the pinned layer 201, a second region 202b adjacent to the free layer 203, and a metal layer 202c disposed between the first region 202a and the second region 202b. The first oxide layer 202 may trap oxygen and/or nitrogen generated during a manufacturing process of the magnetic tunneling junction device 200a to prevent or reduce an amount of and/or impact from diffusion of oxygen or nitrogen into the free layer 203. The first region 202a of the first oxide layer 202 adjacent to the pinned layer 201 may have a relatively low proportion of oxygen and/or nitrogen, and the second region 202b of the first oxide layer 202 adjacent to the free layer 203 may have a relatively high proportion of oxygen and/or nitrogen due to the trapped oxygen and/or nitrogen. In order to more easily capture oxygen and/or nitrogen, the first oxide layer 202 may include a metal oxide having a stoichiometrically oxygen-deficient composition.

Figure 9:
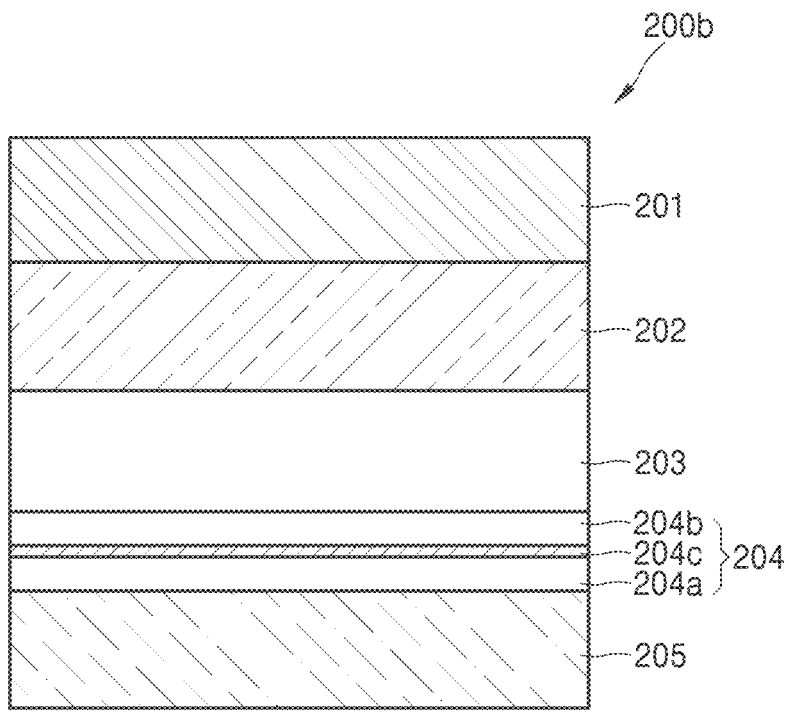
FIG. 9 is a cross-sectional view illustrating a schematic structure of a magnetic tunneling junction device according to some example embodiments.

FIG. 9 is a cross-sectional view showing a schematic structure of a magnetic tunneling junction device 200b according to some example embodiments. Referring to FIG. 9, the magnetic tunneling junction device 200b may include the capping metal layer 205, the second oxide layer 204 disposed on the capping metal layer 205, the free layer 203 disposed on the second oxide layer 204, the first oxide layer 202 disposed on the free layer 203, and the pinned layer 201 disposed on the first oxide layer 202. The magnetic tunneling junction device 200a shown in FIG. 9 differs from the magnetic tunneling junction device 200 shown in FIG. 7 only in the stacking order, and other configurations may be substantially similar.

The second oxide layer 204 may be configured to trap oxygen and/or nitrogen generated in a process of manufacturing the magnetic tunneling junction device 200b. In this case, the second oxide layer 204 may include the first region 204a having a relatively low proportion of oxygen and/or nitrogen and a second region 204b having a relatively high proportion oxygen and/or nitrogen. The first region 204a is a region adjacent to the capping metal layer 205 and the second region 204b is a region adjacent to the free layer 203. The capping metal layer 205 including a metal having an oxygen affinity greater than that of a non-magnetic metal in the free layer 203 may help the second oxide layer 204 to trap oxygen or nitrogen.

In order to more easily trap oxygen and/or nitrogen, the second oxide layer 204 may include a metal oxide having a stoichiometrically oxygen-deficient composition. Alternatively or additionally, in order to more easily trap oxygen and/or nitrogen, the second oxide layer 204 may further include the metal layer 204c disposed between the first region 204a and the second region 204b.

Figure 10:
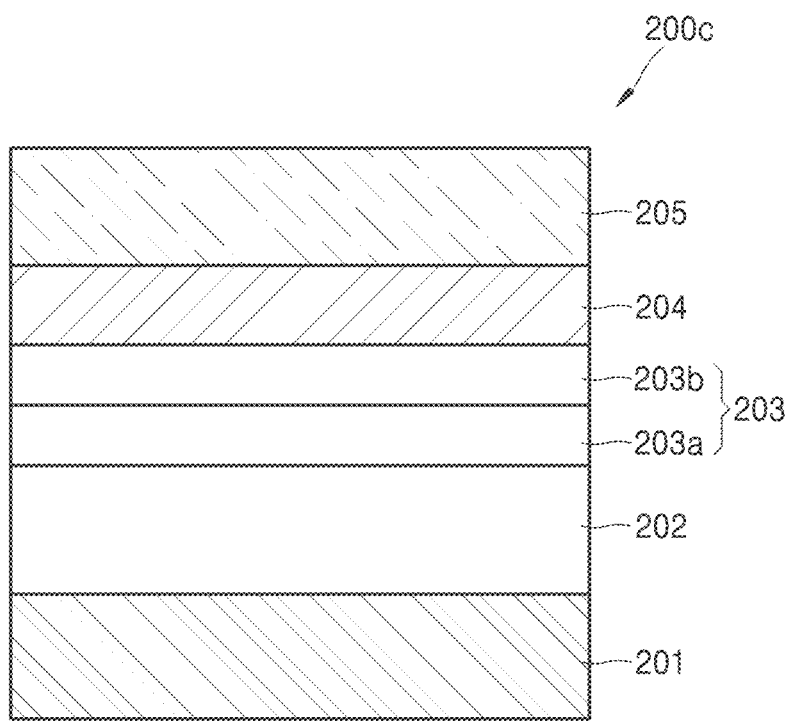
FIG. 10 is a cross-sectional view illustrating a schematic structure of a magnetic tunneling junction device according to some example embodiments.

FIG. 10 is a cross-sectional view showing a schematic structure of a magnetic tunneling junction device 200c according to some example embodiments. Referring to FIG. 10, the magnetic tunneling junction device 200c may include the pinned layer 201, the first oxide layer 202 disposed on the pinned layer 201, the free layer 203 disposed on the first oxide layer 202, the second oxide layer 204 disposed on the free layer 203, and the capping metal layer 205 disposed on the second oxide layer 204. The free layer 203 may include a first free layer 203a disposed on the first oxide layer 202 and a second free layer 203b disposed on the first free layer 203a. The second oxide layer 204 may be disposed on the second free layer 203b. The first free layer 203a may include a magnetic material which is not doped with a non-magnetic metal. For example, the magnetic material in the first free layer 203a may include at least one of CoFe, CoFeB, CoFeNiB, and FeB. The second free layer 203b may include a magnetic material doped with a non-magnetic metal. For example, the magnetic material in the second free layer 203b may include at least one of CoFe and CoFeB doped with the non-magnetic metal.

Figure 11:
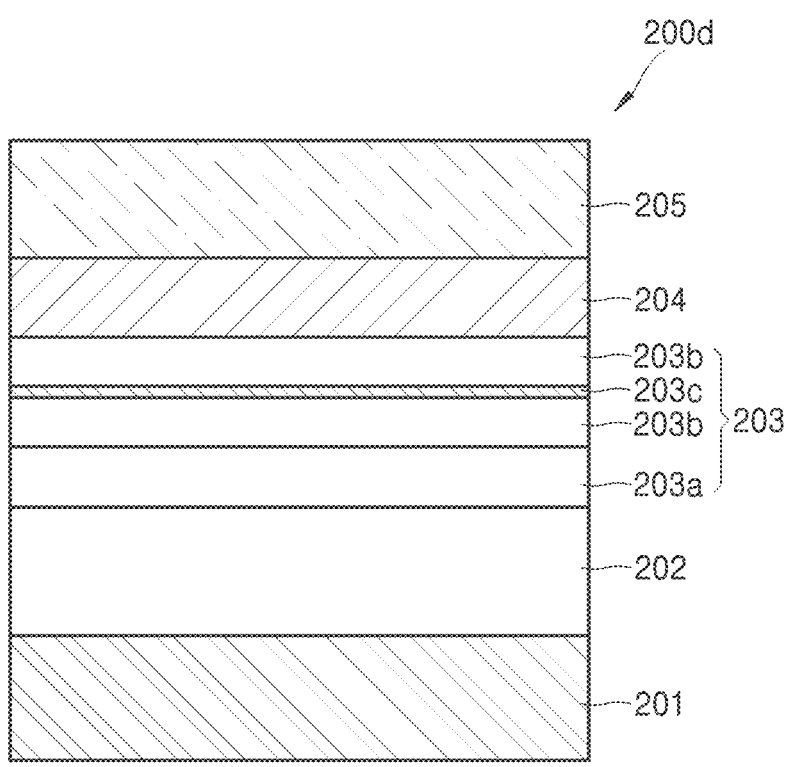
FIG. 11 is a cross-sectional view illustrating a schematic structure of a magnetic tunneling junction device according to some example embodiments.

FIG. 11 is a cross-sectional view showing a schematic structure of a magnetic tunneling junction device 200d according to some example embodiments. Referring to FIG. 11, the free layer 203 of the magnetic tunneling junction device 200d may further include a non-magnetic metal layer 203c interposed in the second free layer 203b. The second free layer 203b may be divided by the non-magnetic metal layer 203c into two portions such that a lower portion of the second free layer 203b is in contact with a lower surface of the non-magnetic metal layer 203c and an upper portion of the second free layer 203b is in contact with an upper surface of the non-magnetic metal layer 203c. The non-magnetic metal layer 203c may include, for example, Mo, V, W, Nb, Ta, Mg, Al, Zr, Cr, Hf, and Ge. In particular, the non-magnetic metal layer 203c may include the same non-magnetic metal as doped in the second free layer 203b.

Figure 12:
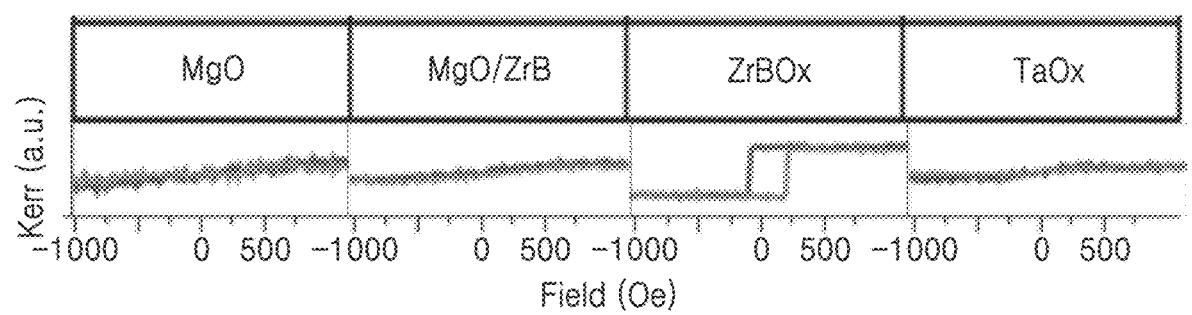
FIG. 12 shows graphs illustrating a Kerr intensity with respect to a magnetic field in the magnetic tunneling junction device of FIG. 1 according to various oxides when a free layer is doped with aluminum (Al)

FIG. 12 shows graphs illustrating a Kerr intensity with respect to a magnetic field in the magnetic tunneling junction device 100 of FIG. 1 according to various oxides when the free layer 103 is doped with aluminum (Al). For example, the free layer 103 of the magnetic tunneling junction device 100 includes FeAl. Referring to FIG. 12, it can be seen that the IPMA is not generated in the free layer 103 when the second oxide layer 104 includes MgO, MgO/ZrB, or $TaO_x$ while the IPMA is generated in the free layer 103 when the second oxide layer 104 includes $ZrBO_x$. This is because the oxygen affinity of Mg and Ta in the second oxide layer is smaller than the oxygen affinity of Al. On the contrary, since Zr in the second oxide layer 104 is greater than the oxygen affinity of Al, the IPMA is generated in the free layer 103 when the second oxide layer 104 includes $ZrBO_x$.

Figure 13:
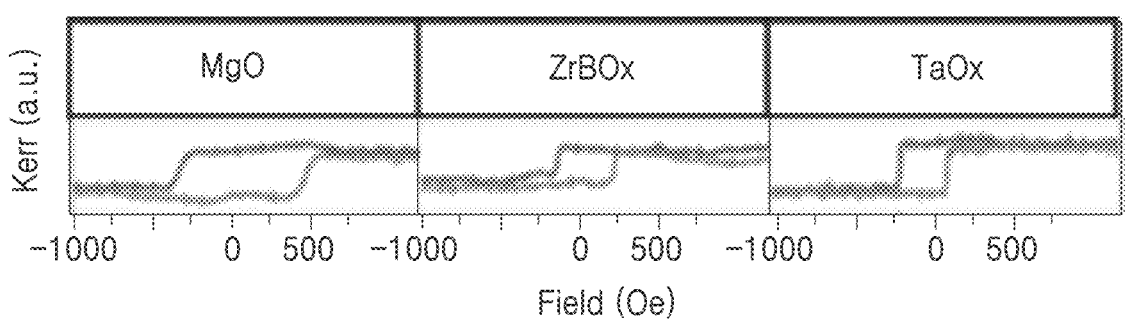
FIG. 13 shows graphs illustrating a Kerr intensity with respect to a magnetic field in the magnetic tunneling junction device of FIG. 1 according to various oxides when the free layer is doped with molybdenum (Mo)

FIG. 13 shows graphs illustrating a Kerr intensity with respect to a magnetic field in the magnetic tunneling junction device 100 of FIG. 1 according to various oxides when the free layer 103 is doped with molybdenum (Mo). The free layer 103 of the magnetic tunneling junction device 100 includes FeMo. Referring to FIG. 13, it can be seen that the IPMA is generated in the free layer 103 for every examples when the free layer 103 is doped with molybdenum (Mo), because Mo has relatively low oxygen affinity. Therefore, the doping concentration of Mo in the free layer 103 may be lower than the doping concentration of the other non-magnetic metals in the free layer 103. For example, the doping concentration of Mo in the free layer 103 may be in a range of about 5 at % to about 20 at %.

Figure 14:
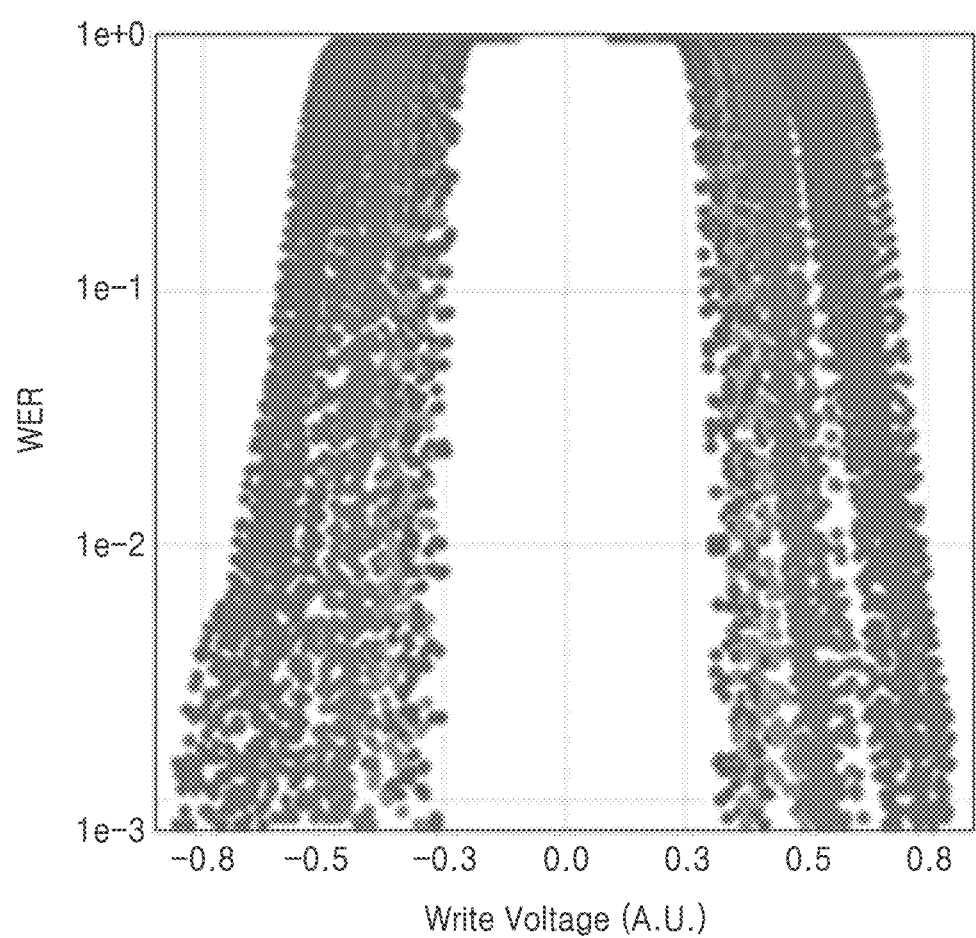
FIG. 14 shows a graph illustrating a WER (write error rate) characteristics of a comparative example.
Figure 15:
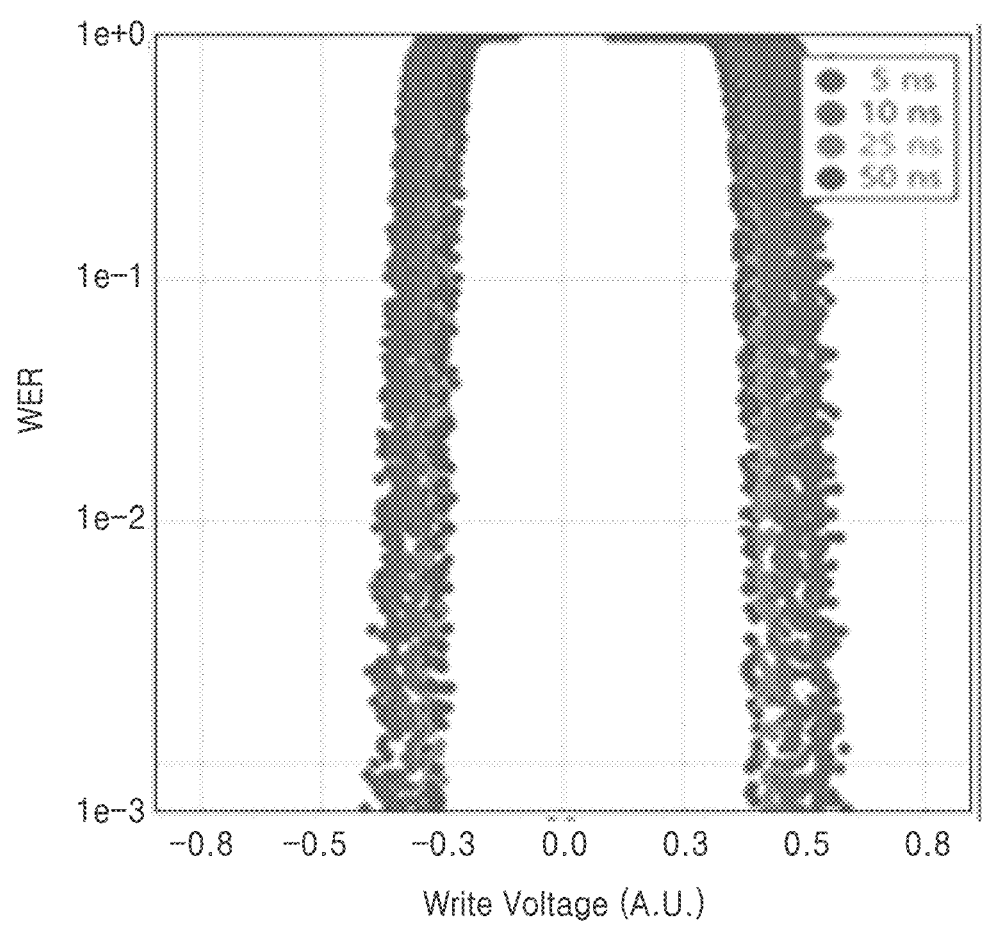
FIG. 15 shows a graph illustrating a WER characteristics of an example embodiment.

FIG. 14 shows a graph illustrating a WER (write error rate) characteristics of a comparative example and FIG. 15 shows a graph illustrating a WER characteristics of an example embodiment. The comparative example and the example embodiment have the structure shown in FIG. 1. In the comparative example, the free layer includes CoFeB. In the example embodiment, the free layer includes CoFeBMo. Referring to FIGS. 14 and 15, it can be seen that the WER characteristics is improved in the example embodiment. For example, a WER slope of the example embodiment is greater than that of the comparative example. According to the example embodiment, for example, a switching voltage of about 0.5 V can be achieved at an operating speed of about 5 nsec.

FIG. 16 shows a table regarding various characteristics of some example embodiments and a comparative example. The comparative example has the structure shown in FIG. 1. In the comparative example, the free layer includes CoFeB and the pinned layer includes CoPt. Example embodiments E1 and E2 have the structure shown in FIG. 5 and example embodiments E3 to E6 have the structure shown in FIG. 6. In the example embodiments E1 to E6, the pinned layer includes CoPt and the first free layer includes CoFeB. The second free layer includes CoFeMo in the example embodiments E1 to E4 and includes CoFeBMo in the example embodiments E5 and E6. In the example embodiments E3 to E6, the non-magnetic metal layer formed of Mo is interposed in the second free layer. In the example embodiments E1 to E6, the doping concentration of Mo in the second free layer is 15 at %. The second oxide layer includes MgO in the example embodiments E1, E3, and E5 and includes TaO in the example embodiments E2, E4, and E6. Referring to FIG. 16, the example embodiments and the comparative example have similar TMR ratios. However, in comparison with the comparative example, the example embodiments have relatively lower Mst (the product of the saturation magnetization Ms and the thickness of the free layer) and relatively higher Hk (an anisotropy field).

Figure 17:
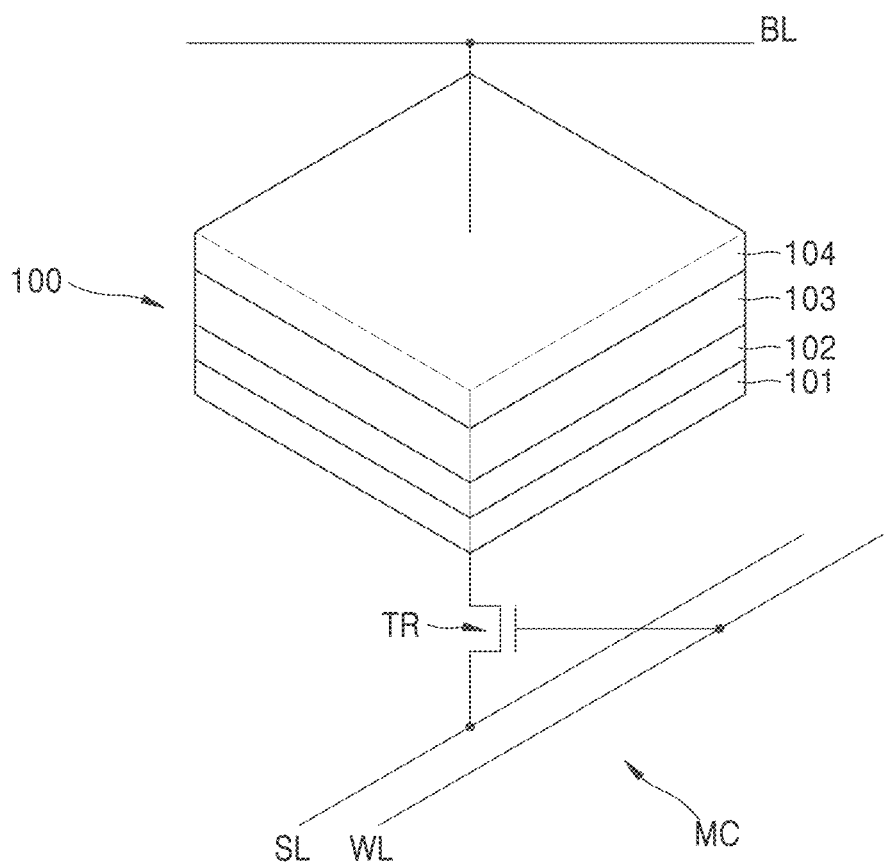
FIG. 17 schematically shows one memory cell including a magnetic tunneling junction device according to some example embodiments.

FIG. 17 schematically shows one memory cell including the magnetic tunneling junction device 100 according to some example embodiments. Referring to FIG. 17, the memory cell MC may include the magnetic tunneling junction device 100 and a switching device TR connected to the magnetic tunneling junction device 100. The switching device TR may be a transistor such as a thin film transistor. The memory cell MC may be connected between a bit line BL and a word line WL. The bit line BL and the word line WL may be disposed to cross each other, and the memory cell MC may be disposed in an intersection point of the bit line BL and the word line WL. The bit line BL may be electrically connected to the free layer 103 of the magnetic tunneling junction device 100 and the word line WL may be connected to a gate of the switching device TR. In addition, a first source/drain electrode of the switching device TR may be electrically connected to the pinned layer 101 of the magnetic tunneling junction device 100 and a second source/drain electrode of the switching device TR may be electrically connected to a selection line SL. In this structure, one or more of a write current, a read current, an erase current, etc. may be applied to the memory cell MC through the word line WL and the bit line BL. In FIG. 17, it is shown that the memory cell MC includes the magnetic tunneling junction device 100 shown in FIG. 1, but in various other embodiments, the memory cell MC may include another magnetic tunneling junction device described with reference to other figures.

Figure 18:
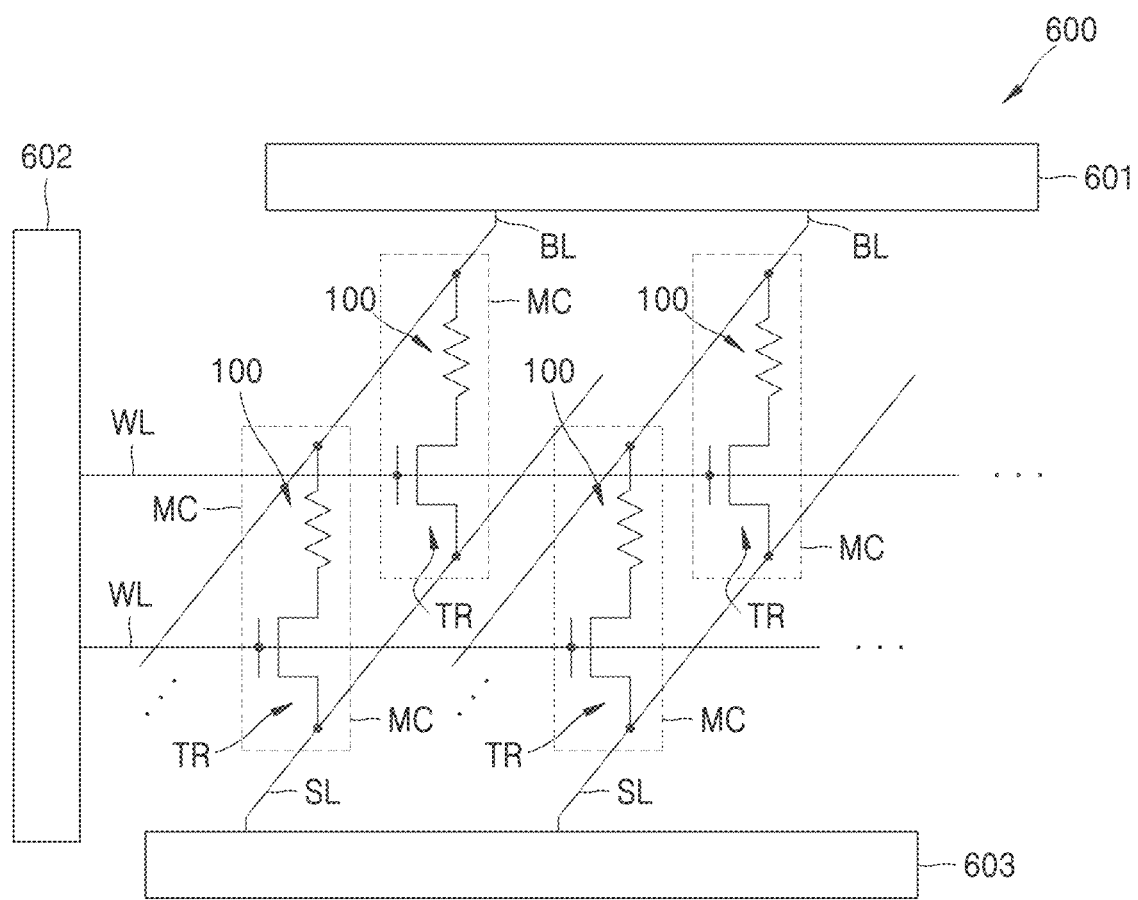
FIG. 18 is a circuit diagram schematically illustrating a configuration of a memory device including a plurality of memory cells shown in FIG. 8.

FIG. 18 is a circuit diagram schematically illustrating a configuration of a memory device 600 including the plurality of memory cells MCs shown in FIG. 17. Referring to FIG. 18, the memory device 600 may include a plurality of bit lines BL, a plurality of word lines WL, a plurality of selection lines SL, the plurality of memory cells MCs respectively disposed in intersection points of the plurality of bit lines BL and the plurality of word lines WL, a bit line driver 601 applying current to the plurality of bit lines BL, a word line driver 602 applying current to the plurality of word lines WL and a selection line driver 603 applying current to the plurality of selection lines SL. Each memory cell MC may have the configuration shown in FIG. 17.

The memory device 600 illustrated in FIG. 18 may be or may include a magnetic random access memory (MRAM), and may be used in electronic devices using nonvolatile memory. In particular, the memory device 600 illustrated in FIG. 18 may be an STT-MRAM in which a magnetization direction of a free layer is changed by a spin current directly applied to the free layer of the magnetic tunneling junction device. The STT-MRAM does not require or use a separate wire for generating an external magnetic field, and thus the STT-MRAM is advantageous for high integration and has a simple operation method. Although the STT-MRAM is shown as an example in FIG. 18, the magnetic tunneling junction device may be applied to SOT-MRAM.

It should be understood that various example embodiments described herein should be considered in a descriptive sense only and not for purposes of limitation. Descriptions of features or aspects within each example embodiment should typically be considered as available for other similar features or aspects in other example embodiments. None of the described example embodiments are necessarily mutually exclusive with one another. For example, some example embodiments may include features described with reference to one or more figure, and may also include one or more other features described with reference to one or more other figures. While one or more example embodiments have been described with reference to the figures, it will be understood by those of ordinary skill in the art that various changes in form and details may be made therein without departing from the spirit and scope as defined by the following claims.

What is claimed is:

1. A magnetic tunneling junction device comprising:
   a free layer having a first surface and a second surface opposite the first surface;
   a pinned layer facing the first surface of the free layer;
   a first oxide layer between the pinned layer and the free layer; and
   a second oxide layer on the second surface of the free layer,
   wherein the free layer comprises a magnetic material doped with a non-magnetic metal,
   the second oxide layer comprises a metal oxide, and
   a metal in the metal oxide of the second oxide layer is different from the non-magnetic metal of the free layer such that a first oxygen affinity of the metal in the metal oxide of the second oxide layer is greater than a second oxygen affinity of the non-magnetic metal of the free layer.

2. The magnetic tunneling junction device of claim 1, wherein the magnetic material of the free layer comprises at least one of Fe, Co, Ni, Mn, a Fe-containing alloy, a Co-containing alloy, a Ni-containing alloy, a Mn-containing alloy and a Heusler alloy.

3. The magnetic tunneling junction device of claim 1, wherein the non-magnetic metal of the free layer comprises at least one of Mo, V, W, Nb, Ta, Mg, Al, Zr, Cr, Hf, and Ge.

4. The magnetic tunneling junction device of claim 1, wherein the metal in the metal oxide of the second oxide layer comprises at least one metal element having an oxygen affinity greater than that of the non-magnetic metal of the free layer, the at least one metal element being at least one of Ta, Mg, Zr, Ti, Hf, Nb, Tb, Sc, Y, W, V, Al, and Zr.

5. The magnetic tunneling junction device of claim 1, wherein the non-magnetic metal of the free layer is molybdenum (Mo), and the metal in the metal oxide of the second oxide layer comprises at least one metal element selected from Ta, Mg, Zr, Ti, Hf, Nb, Tb, Sc, Y, W, V, Al, and Zr.

6. The magnetic tunneling junction device of claim 5, wherein a doping concentration of Mo in the free layer is in a range of about 5 at % to about 20 at %.

7. The magnetic tunneling junction device of claim 1, wherein the non-magnetic metal of the free layer is tantalum (Ta), and the metal in the metal oxide of the second oxide layer comprises at least one metal element selected from Ti, Al, Zr, Hf, Tb, Sc, and Y.

8. The magnetic tunneling junction device of claim 1, wherein the metal oxide of the second oxide layer has a first oxide formation energy greater than a second oxide formation energy of the oxide of the non-magnetic metal in the free layer.

9. The magnetic tunneling junction device of claim 1, wherein the free layer comprises a first free layer and a second free layer between the first free layer and the second oxide layer,
the first free layer comprises at least one of CoFe, CoFeB, CoFeNiB, and FeB,
the second free layer comprises the magnetic material doped with the non-magnetic metal, and
the magnetic material in the second free layer comprises at least one of CoFe and CoFeB.

10. The magnetic tunneling junction device of claim 9, wherein a thickness of the first free layer is in a range of about 0.4 nm to about 0.8 nm, and
a thickness of the second free layer is in a range of about 0.4 nm to about 3 nm.

11. The magnetic tunneling junction device of claim 9, wherein the second free layer comprises a non-magnetic metal layer interposed in the second free layer.

12. A magnetic tunneling junction device comprising:
a free layer having a first surface and a second surface opposite the first surface;
a pinned layer facing the first surface of the free layer;
a first oxide layer between the pinned layer and the free layer;
a second oxide layer on the second surface of the free layer; and
a capping metal layer in contact with the second oxide layer,
wherein the free layer comprises a magnetic material doped with a non-magnetic metal, and
a metal in the capping metal layer is different from the non-magnetic metal of the free layer such that the capping metal layer comprises the metal having a first oxygen affinity greater than a second oxygen affinity of the non-magnetic metal of the free layer.

13. The magnetic tunneling junction device of claim 12, wherein the non-magnetic metal of the free layer comprises at least one of Mo, V, W, Nb, Ta, Mg, Al, Zr, Cr, Hf, and Ge.

14. The magnetic tunneling junction device of claim 12, wherein the metal of the capping metal layer comprises at least one metal element having a first oxygen affinity greater than a second oxygen affinity of the non-magnetic metal of the free layer, the at least one metal element selected from Ta, Mg, Zr, Ti, Hf, Nb, Tb, Sc, Y, W, V, Al, and Zr.

15. The magnetic tunneling junction device of claim 12, wherein the non-magnetic metal of the free layer is molybdenum (Mo), and the metal of the capping metal layer comprises at least one metal element selected from Ta, Mg, Zr, Ti, Hf, Nb, Tb, Sc, Y, W, V, Al, and Zr.

16. The magnetic tunneling junction device of claim 15, wherein a doping concentration of Mo in the free layer is in a range of about 5 at % to about 20 at %.

17. The magnetic tunneling junction device of claim 12, wherein the non-magnetic metal of the free layer is tantalum (Ta), and the metal of the capping metal layer comprises at least one metal element selected from Ti, Al, Zr, Hf, Tb, Sc, and Y.

18. The magnetic tunneling junction device of claim 12, wherein the free layer comprises a first free layer and a second free layer between the first free layer and the second oxide layer,
the first free layer comprises at least one of CoFe, CoFeB, CoFeNiB, and FeB,
the second free layer comprises the magnetic material doped with the non-magnetic metal, and
the magnetic material in the second free layer comprises at least one of CoFe and CoFeB.

19. The magnetic tunneling junction device of claim 18, wherein the second free layer comprises a non-magnetic metal layer interposed in the second free layer.

20. A memory device comprising:
a plurality of memory cells each comprising a switching device connected to a magnetic tunneling junction device,
wherein the magnetic tunneling junction device comprises,
a free layer having a first surface and a second surface opposite the first surface,
a pinned layer facing the first surface of the free layer,
a first oxide layer between the pinned layer and the free layer, and
a second oxide layer on the second surface of the free layer,
wherein the free layer comprises a magnetic material doped with a non-magnetic metal,
the second oxide layer comprises a metal oxide, and
a metal in the metal oxide of the second oxide layer is different from the non-magnetic metal of the free layer such that a first oxygen affinity of the metal in the metal oxide of the second oxide layer is greater than a second oxygen affinity of the non-magnetic metal of the free layer.

* * * * *